(12) United States Patent
Huang

(10) Patent No.: US 7,869,262 B2
(45) Date of Patent: Jan. 11, 2011

(54) MEMORY DEVICE WITH AN ASYMMETRIC LAYOUT STRUCTURE

(75) Inventor: Huai-Ying Huang, Jhonghe (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1011 days.

(21) Appl. No.: 11/699,089

(22) Filed: Jan. 29, 2007

(65) Prior Publication Data

US 2008/0180980 A1  Jul. 31, 2008

(51) Int. Cl.
*G11C 11/00* (2006.01)

(52) U.S. Cl. ............... 365/154; 365/51; 257/368; 257/388; 257/412

(58) Field of Classification Search ............... 365/154, 365/51; 257/368, 388, 412
See application file for complete search history.

(56) References Cited

U.S. PATENT DOCUMENTS

| | | | | |
|---|---|---|---|---|
| 7,279,755 B2* | 10/2007 | Lee et al. | ............ | 257/368 |
| 7,521,715 B2* | 4/2009 | Jang et al. | ............ | 257/69 |
| 2005/0111251 A1* | 5/2005 | Liaw | ............ | 365/154 |
| 2007/0090428 A1* | 4/2007 | Liaw | ............ | 257/296 |
| 2007/0241411 A1* | 10/2007 | Yang et al. | ............ | 257/383 |

\* cited by examiner

*Primary Examiner*—Tuan T Nguyen
*Assistant Examiner*—Toan Le
(74) *Attorney, Agent, or Firm*—K&L Gates LLP

(57) ABSTRACT

An SRAM device includes a first inverter; a second inverter cross-coupled with the first inverter; a first pass gate transistor connecting the first inverter to a bit line; and a second pass gate transistor connecting the second inverter to a complementary bit line, wherein the first or second pass gate transistor has a layout structure where a first distance between its gate conductive layer and its source contact is purposefully designed to be substantially different from a second distance between its gate conductive layer and its drain contact for reducing leakage current induced by misalignment of the gate conductive layer with respect to the source contact.

15 Claims, 5 Drawing Sheets

F I G. 6 A
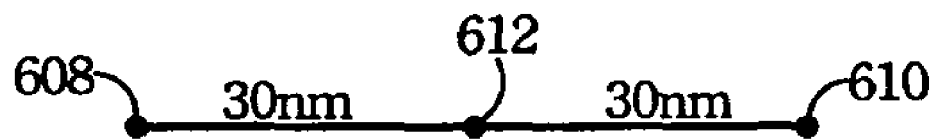
F I G. 6 B

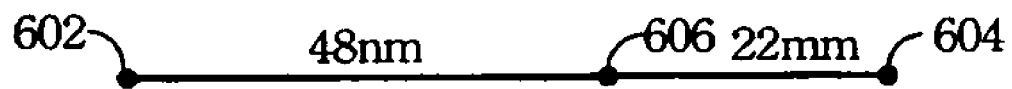
F I G . 7 A
F I G . 7 B

MEMORY DEVICE WITH AN ASYMMETRIC LAYOUT STRUCTURE

BACKGROUND

The present invention relates generally to integrated circuit (IC) designs, and more particularly to a memory device with an asymmetric layout structure.

FIG. 1 schematically illustrates a typical static random access memory (SRAM) cell 100 that is often used in memory devices for electronic products, such as cellular phones, digital cameras, personal digital assistants, and personal computers. The cell 100 includes two cross-coupled inverters 102 and 104. The inverter 102 is comprised of a pull-up p-type metal-oxide-semiconductor (PMOS) transistor 106 and a pull-down n-type metal-oxide-semiconductor (NMOS) transistor 108. The inverter 104 is comprised of a pull-up PMOS transistor 110 and a pull-down NMOS transistor 112. The sources of the PMOS transistors 106 and 110 are coupled to a power supply Vcc. The sources of the NMOS transistors 108 and 112 are coupled to ground or a complementary power supply through Vss. The gates of PMOS transistor 106 and NMOS transistors 108 are connected together at a node 114, which is further connected to the drains of PMOS transistor 110 and NMOS transistor 112. The gates of PMOS transistor 110 and NMOS transistor 112 are connected together at node 116, which is further connected to the drains of PMOS transistor 106 and NMOS transistor 108. A first pass gate transistor 118 is coupled between the node 114 and a bit line BL, and a second pass gate transistor 120 is coupled between the node 116 and a complementary bit line BLB. The cross-coupled first and second inverters 102 and 104 function as a latch that stores a value and its complement at the nodes 114 and 116, respectively.

FIG. 2 illustrates a layout structure 200 of the SRAM cell shown in FIG. 1. A first n-type doped region 202 and a second n-type doped region 208 are formed on p-wells in a semiconductor substrate. A first p-type doped region 204 and a second p-type region 206 are formed on the semiconductor substrate. A gate conductive layer 210 is formed above the doped region 202 and across it along its transverse direction. A gate conductive layer 212 is formed above the doped regions 202 and 204 and across them along their transverse directions. Similarly, a gate conductive layer 216 is formed above the doped region 208 and across it along its transverse direction. A gate conductive layer 214 is formed above the doped regions 208 and 206 and across them along their traverse directions. The gate conductive layer 210 and the doped region 202 thereunder function as a pass gate transistor PG. The gate conductive layer 212 and the doped regions 202 and 204 thereunder function as a pull-down transistor PD and a pull-up transistor PU, respectively. A contact 240 for the source of the pull-down transistor PD, a contact 222 for the drain of the pass gate transistor PG, and a contact 220 for the source of the pass gate transistor PG are formed on the doped region 202, and separated by the gate conductive layers 210 and 212.

As the semiconductor processing technology advances, the scale of the layout structure 200 for the SRAM cell 100 becomes increasingly small. As a result, the gate conducive layer 210 and the contact 220 for the source terminal of the PG transistor become increasingly close. This causes the gate conductive layer 210 and the contact 220 to be particularly susceptible to a birding effect, due to insufficient clearance therebetween. Such bridging effect is likely to induce leakage current. For example, due to process variations, the gate conductive layer 210 may down shift toward the contact 220. As a result, the leakage current would occur due to the closeness between the gate conductive layer 210 and the contact 220.

As such, what is needed is a memory device with improved layout structure that helps reduce the leakage current between the gate and source of the pass gate transistor PG.

SUMMARY

The present invention discloses an SRAM device. In one embodiment of the invention, the SRAM device includes a first inverter; a second inverter cross-coupled with the first inverter; a first pass gate transistor connecting the first inverter to a bit line; and a second pass gate transistor connecting the second inverter to a complementary bit line, wherein the first or second pass gate transistor has a layout structure where a first distance between its gate conductive layer and its source contact is purposefully designed to be substantially different from a second distance between its gate conductive layer and its drain contact for reducing leakage current induced by misalignment of the gate conductive layer with respect to the source contact.

The construction and method of operation of the invention, however, together with additional objectives and advantages thereof will be best understood from the following description of specific embodiments when read in connection with the accompanying drawings.

BRIEF DESCRIPTION OF THE DRAWINGS

FIGS. 6A and 6B compare a proposed asymmetric layout structure with a conventional layout structure.

FIGS. 7A and 7B compare the proposed asymmetric layout structure with the conventional layout structure as a result of a process variation.

DESCRIPTION

Figure 1:
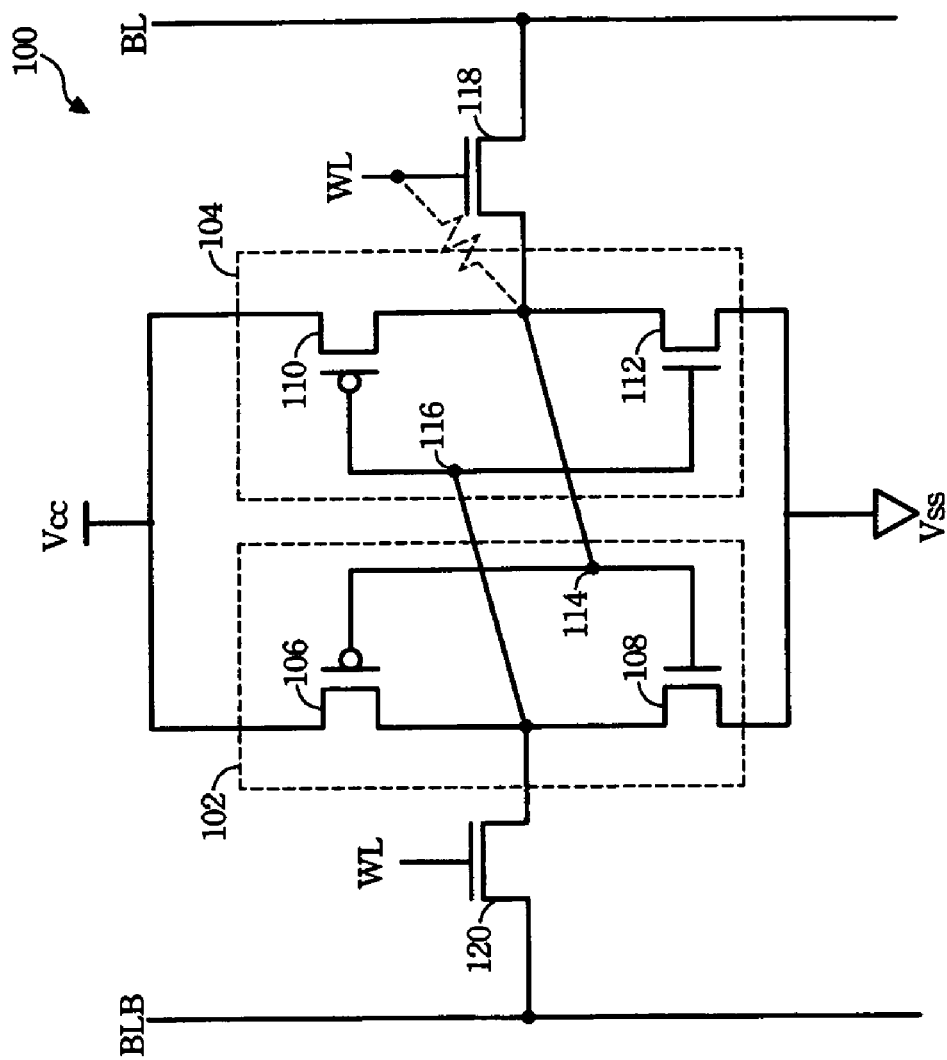
FIG. 1 schematically illustrates a typical SRAM cell.
Figure 2:
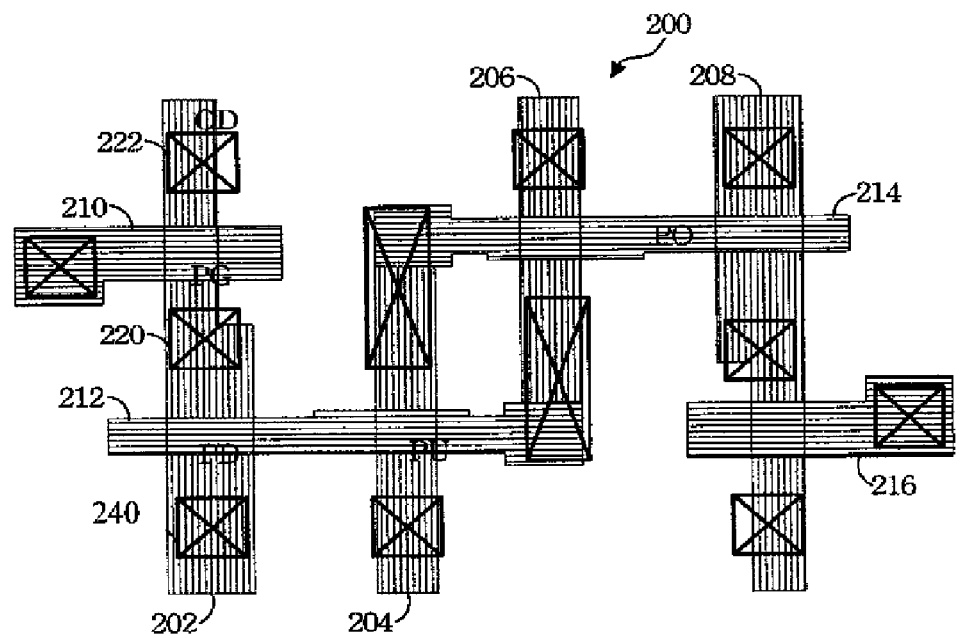
FIG. 2 illustrates a conventionally layout structure of an SRAM cell.
Figure 3:
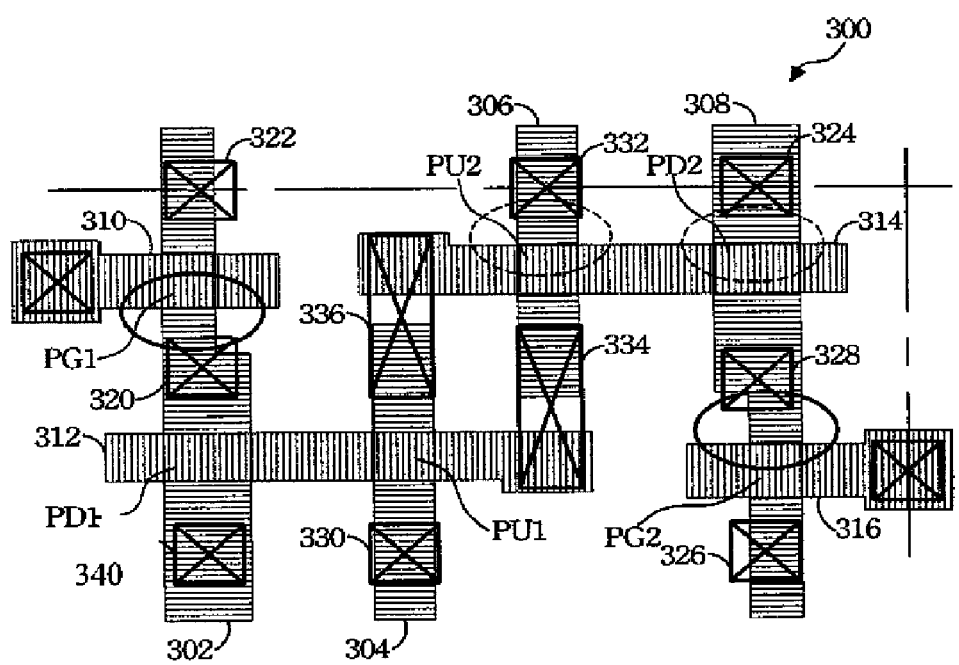
FIG. 3 illustrates a layout structure of an SRAM cell in accordance with one embodiment of the present invention.

FIG. 3 illustrates a layout structure 300 of the SRAM cell shown in FIG. 1 in accordance with one embodiment of the present invention. A first n-type doped region 302 and a second n-type doped region 308 are formed on p-wells in a semiconductor substrate. A first p-type doped region 304 and a second p-type region 306 are formed on the semiconductor substrate. A gate conductive layer 310 is formed above the doped region 302 and across it along its transverse direction. A gate conductive layer 312 is formed above the doped regions 302 and 304 and across them along their transverse directions. Similarly, a gate conductive layer 316 is formed above the doped region 308 and across it along its transverse direction. A gate conductive layer 314 is formed above the doped regions 308 and 306 and across them along their traverse directions. The gate conductive layer 310 and the doped region 302 thereunder function as a pass gate transistor PG1. The gate conductive layer 312 and the doped regions 302 and 304 thereunder function as a pull-down transistor PD1 and a pull-up transistor PU1, respectively. Similarly, the gate conductive layer 316 and the doped region 308 thereunder function as a pass gate transistor PG2. The gate conductive layer 314 and the doped regions 308 and 306 thereunder function as a pull-down transistor PD2 and a pull-up transistor PU2, respectively.

A contact 340 for the source of the pull-down transistor PD1, a contact 322 for the drain of the pass gate transistor PG1, and a contact 320 for the source of the pass gate transistor PG1 are formed on the doped region 302, and separated by the gate conductive layers 310 and 312. A contact 324 for the source of the pull-down transistor PD2, a contact 326 for the drain of the pass gate transistor PG2, and a contact 328 for the source of the pass gate transistor PG2 are formed on the doped region 308, and separated by the gate conductive layers 316 and 314. Source contacts 330 and 332 are constructed on the doped regions 304 and 306, respectively. A contact 334 connects the doped region 306 and the gate conductive layer 312. A contact 336 connects the doped region 304 and the gate conductive layer 314.

The layout structure 300 has an asymmetric design that helps reduce leakage current between the gate, source and pass gate transistors. The distance between the gate conductive layer 310 and the source contact 320 for the pass gate transistor PG1 is substantially longer than the distance between the gate conductive layer 310 and the drain contact 322 for the pass gate transistor PG1. The distance between the gate conductive layer 316 and the source contact 328 for the pass gate transistor PG2 is substantially longer than the distance between the gate conductive layer 316 and the drain contact 326 for the pass gate transistor PG2. In this embodiment, the distance between the gate conductive layer 310 and the source contact 320 ranges approximately from 100 to 200 percent of the distance between the gate conductive layer 310 and the drain contact 322. The distance between the gate conductive layer 310 or 316 and the source contact 320 or 328 is substantially the same as the distances between other gate conductive layers and contacts. For example, the distance between the gate conductive layer 314 and the contact 332 and the distance between the gate conductive layer 314 and the contact 324, are substantially the same as the distance between the gate conductive layer 310 and the contact 322. As a result, the contacts 322, 332 and 324 are substantially in alignment, and the gate conductive layers 310 and 314 are substantially misaligned.

The longer distance between the gate conductive layer 310 and the source contact 320 allows the layout structure 300 to better withstand process variations, without inducing leakage current. Two exemplary layout structures of an SRAM cell produced by varied processes are described in the following paragraphs.

Figure 4:
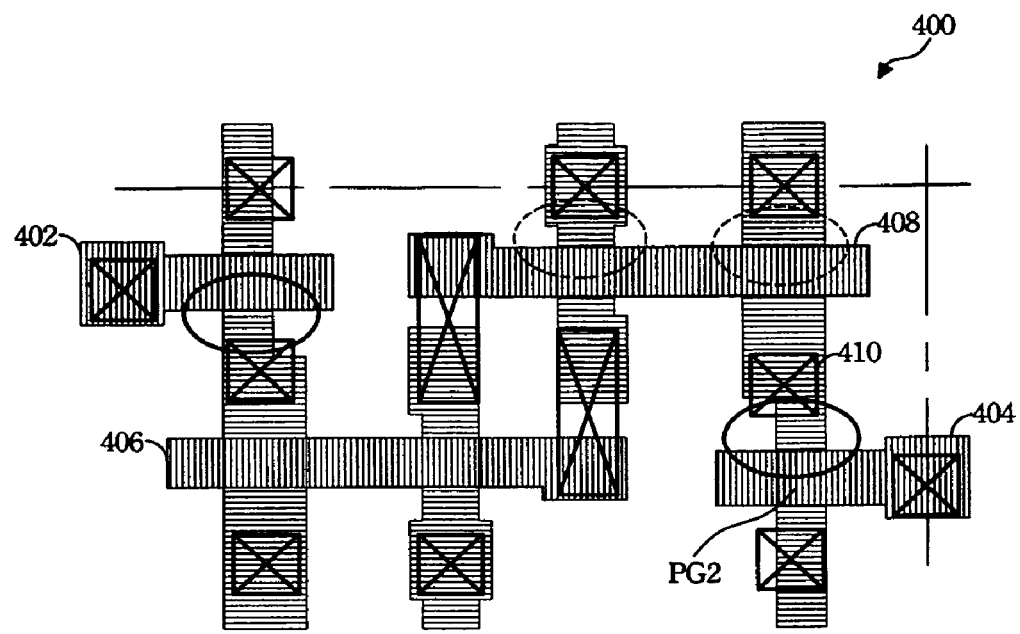
FIG. 4 illustrates a layout structure of an SRAM cell, in which gate conductive layers are shifted upwards, in accordance with another embodiment of the present invention.

FIG. 4 illustrates a layout structure 400 of an SRAM cell where the conductive layers 402, 404, 406 and 408 shifts upwards due to process variation. Due to the asymmetric design, the gate conductive layer 404 and the source contact 410 for the pass gate device PG2 can still maintain a sufficient distance. Thus, the leakage current between the gate conductive layer 404 and the source contact 410 can be reduced.

Figure 5:
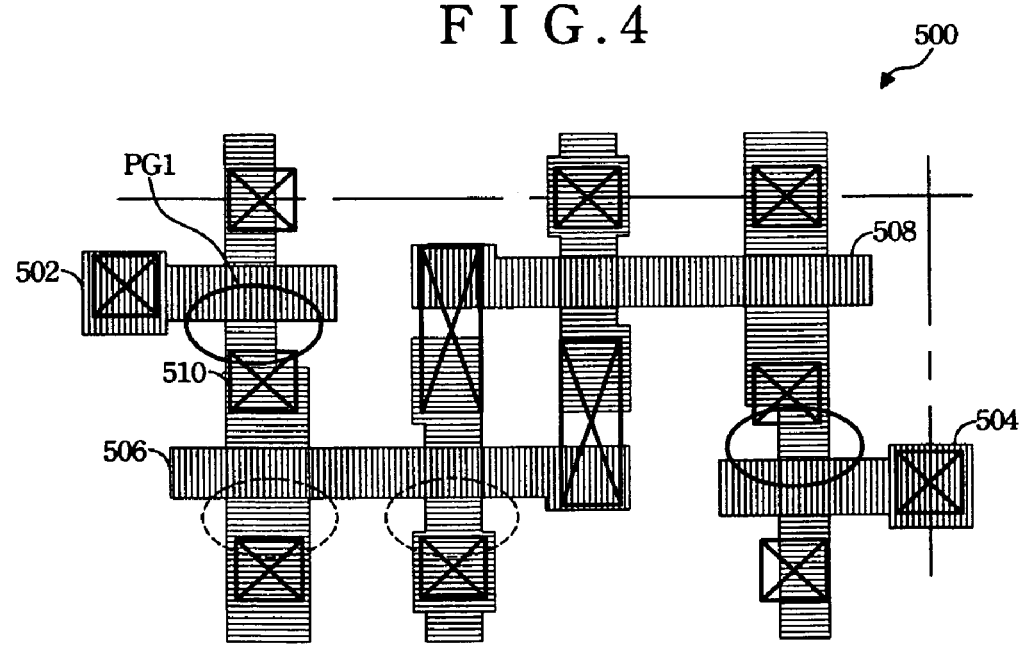
FIG. 5 illustrates a layout structure of an SRAM cell, in which gate conductive layers are shifted downwards, in accordance with another embodiment of the present invention.

FIG. 5 illustrates a layout structure 500 of an SRAM cell where the conductive layers 502, 504, 506 and 508 shifts downwards due to process variation. Due to the asymmetric design, the gate conductive layer 502 and the source contact 510 for the pass gate device PG1 can still maintain a sufficient distance. Thus, the leakage current between the gate conductive layer 502 and the source contact 510 can be reduced.

FIGS. 6A through 7B illustrate a number of diagrams comparing the proposed asymmetric layout structure with the conventional symmetric layout structure. Referring to FIG. 6A, nodes 602, 604 and 606 represent a drain contact, a source contact and a gate conductive layer for a pass gate transistor in an SRAM cell, respectively, in accordance with the proposed asymmetric layout structure of the present invention. The distance between the nodes 602 and 606 is assumed to be 30 nm and the distance between the nodes 606 and 604 is assumed to be 40 nm. Referring to FIG. 6B, nodes 608, 610 and 612 represent a drain contact, a source contact and a gate conductive layer for a pass gate transistor in a conventional SRAM cell, respectively. The distance between the nodes 608 and 612 is assumed to be 30 nm and the distance between the nodes 612 and 610 is also assumed to be 30 nm.

Referring to FIG. 7A, due to process variation, the gate conductive layer of the proposed layout structure is shifted to the right by, say, 18 nm. As a result, the distance between the nodes 602 and 606 becomes 48 nm, and the distance between the nodes 606 and 604 becomes 22 nm. Referring to FIG. 7B, due to the same process variation, the gate conductive layer of the conventional layout structure is shifted to the right by 18 nm. As a result, the distance between the nodes 602 and 606 becomes 48 nm, and the distance between the nodes 606 and 604 becomes 12 nm. Since distance between the nodes 606 and 604 is longer than the distance between the nodes 612 and 610, the proposed layout structure can reduce the leakage current between the gate conductive layer and the source contact of the pass gate transistor.

The proposed asymmetric layout structure for SRAM cells can reduce the leakage current between the gate conducive layer and the source contact of the pass gate transistor, thereby reducing the failure rates of the memory devices that fail to meet the minimal power requirement. The increased distance between the gate conducive layer and the source contact of the pass gate transistor does not increase the cell area substantially. For example, if the distance between the gate conducive layer and the source contact of the pass gate transistor is increased by 10 nm, the cell area increases only above 3.15%. Thus, the proposed layout structure does not cause a substantial penalty on the cell area.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A static random access memory (SRAM) device comprising:
   a first inverter;
   a second inverter cross-coupled with the first inverter;
   a first pass gate transistor connecting the first inverter to a bit line through its source contact; and
   a second pass gate transistor connecting the second inverter to a complementary bit line through its source contact,
   wherein the first or second pass gate transistor has a layout structure where a first distance between its gate conductive layer and its source contact is purposefully designed to be substantially different from a second distance between its gate conductive layer and its drain contact for improving stability of the SRAM device, and wherein the first inverter further comprises a pull-up transistor whose source contact is connected to a power supply voltage (Vcc), the pull-up transistor having a layout structure where a third distance between its gate conductive layer and its source contact thereof is substantially the same as the second distance.

2. The SRAM device of claim 1, wherein the first distance is substantially longer than the second distance.

3. The SRAM device of claim 2, wherein the second distance approximately ranges from 50 to 100 percent of the first distance.

4. The SRAM device of claim 1, wherein a fourth distance between a gate conductive layer of the pull-up transistor and a drain contact thereof is substantially the same as the second distance.

5. The SRAM device of claim 4, wherein the first or second inverter further comprises a pull-down transistor whose source contact is connected to a complementary power supply voltage (Vss), the pull-down transistor having a layout structure where a fifth distance between a gate conductive layer and its source contact thereof is substantially the same as the second distance.

6. The SRAM device of claim 5, wherein a sixth distance between a gate conductive layer of the pull-down transistor and a drain contact thereof is substantially the same as the second distance.

7. The SRAM device of claim 6, wherein the drain contact of the pass gate transistor, the source contact of the pull-up transistor and the source contact of the pull-down transistor are substantially in alignment.

8. The SRAM device of claim 7, wherein the gate conductive layer of the pass gate transistor and the gate conductive layer of the pull-up and pull-down transistors are substantially misaligned.

9. A static random access memory (SRAM) device having at least one memory cell, whose layout structure comprises:
   a first doped region;
   a second doped region adjacent to the first doped region in parallel;
   a first gate conductive layer extending above and across the first doped region, the first gate conductive layer and the first doped layer together functioning as a pass gate transistor of the memory cell;
   a source contact of the pass gate transistor constructed at one side of the gate conductive layer on an n-type doped region, wherein the source contact of the pass gate transistor is connected to a bit line; and
   a drain contact of the pass gate transistor constructed at another side of the gate conductive layer on the n-type doped region,
   wherein a first distance between the first gate conductive layer and the source contact is purposefully designed to be substantially different from a second distance between the first gate conductive layer and the drain contact for improving stability of the SRAM device, and
   wherein the layout structure further comprises a second gate conductive layer extending above and across the first and second doped regions, the second gate conductive layer and the first doped region function as a pull-down transistor having its source contact connected to a complementary power supply voltage (Vss), wherein a third distance between the second gate conductive layer and the source contact of the pull-down transistor is substantially the same as the second distance, and
   wherein the second gate conductive layer and the second doped region function as a pull-up transistor having its source contact connected to a power supply voltage (Vcc).

10. The SRAM device of claim 9, wherein the first distance is substantially longer than the second distance.

11. The SRAM device of claim 10, wherein the second distance approximately ranges from 50 to 100 percent of the first distance.

12. The SRAM device of claim 9, wherein a four distance between the second gate conductive layer and the source contact of the pull-up transistor is substantially the same as the second distance.

13. A static random access memory (SRAM) device having at least one memory cell, whose layout structure comprises:
   a first doped region;
   a first gate conductive layer extending above and across the first doped region, the first gate conductive layer and the first doped layer together functioning as a pass gate transistor of the memory cell;
   a source contact of the pass gate transistor constructed at one side of the gate conductive layer on an n-type doped region;
   a drain contact of the pass gate transistor constructed at another side of the gate conductive layer on the n-type doped region;
   a second doped region adjacent to the first doped region in parallel;
   a second gate conductive layer extending above and across the first and second doped regions, the second gate conductive layer and the first doped region functioning as a pull-down transistor, the second gate conductive layer and the second doped region functioning as a pull-up transistor;
   a source contact of the pull-down transistor constructed at one side of the second gate conductive layer on the first doped region; and
   a source contact of the pull-up transistor constructed at one side of the second gate conductive layer on the second doped region,
   wherein a first distance between the first gate conductive layer and the source contact is substantially different from a second distance between the first gate conductive layer and the drain contact,
   wherein a third distance between the second gate conductive layer and the source contact of the pull-down transistor is substantially the same as the second distance,
   wherein a fourth distance between the second gate conductive layer and the source contact of the pull-up transistor is substantially the same as the second distance.

14. The SRAM device of claim 13, wherein the first distance is substantially longer than the second distance.

15. The SRAM device of claim 13, wherein the second distance approximately ranges from 50 to 100 percent of the first distance.

* * * * *